US011334062B2

(12) United States Patent
Kessie et al.

(10) Patent No.: US 11,334,062 B2
(45) Date of Patent: May 17, 2022

(54) METHOD OF EVALUATING A PART

(71) Applicant: General Electric Company, Schenectady, NY (US)

(72) Inventors: Andrew Scott Kessie, Springboro, OH (US); John Sherrill Carpenter, Liberty Township, OH (US); Paul Anthony Maletta, West Chester, OH (US); Tomas Eduardo Elias, Queretaro (MX); Oscar Ernesto Escobar, Queretaro (MX); Kyle Dean Blomgren, Mason, OH (US); Daniel John Maggard, Norwood, OH (US); Brian Russell Clements, Blue Ash, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 786 days.

(21) Appl. No.: 16/055,552

(22) Filed: Aug. 6, 2018

(65) Prior Publication Data
US 2018/0349532 A1 Dec. 6, 2018

Related U.S. Application Data

(63) Continuation of application No. 14/635,581, filed on Mar. 2, 2015, now Pat. No. 10,042,964.

(51) Int. Cl.
*G05B 23/02* (2006.01)
*G06Q 10/00* (2012.01)
(Continued)

(52) U.S. Cl.
CPC ......... *G05B 23/0283* (2013.01); *G06F 30/23* (2020.01); *G06Q 10/0635* (2013.01);
(Continued)

(58) Field of Classification Search
CPC .............. G06Q 10/20; G06Q 10/0635; G05B 23/0283; G05B 23/024; G06F 30/23; G06N 5/022
(Continued)

(56) References Cited

U.S. PATENT DOCUMENTS 5,614,670 A * 3/1997 Nazarian ................. E01C 23/00
73/146
7,328,128 B2 2/2008 Bonanni et al.
(Continued)

FOREIGN PATENT DOCUMENTS

CN 101963937 A 2/2011
EP 1939801 A1 7/2008
(Continued)

OTHER PUBLICATIONS

Preliminary Official Action and Search Report for Brazilian Patent Appl. No. BR 10 2016 003654-2, filed Feb. 22, 2016, 4 pages, dated Jul. 7, 2020.
(Continued)

*Primary Examiner* — Thai Q Phan
(74) *Attorney, Agent, or Firm* — Wood IP LLC

(57) ABSTRACT

A method of evaluating a part is characterized by obtaining data representing a distress rank model (DRM) and a cumulative damage model (CDM) for the part. Based on the data, the method ascertains a DRM value for the part and a CDM value for the part. The method determines whether the DRM value is at or above a predetermined DRM threshold and whether a CDM value is at or above a predetermined CDM threshold. If either the DRM value or the CDM value is at or above at least one respective threshold, an action related to the part is generated.

10 Claims, 6 Drawing Sheets

(51) Int. Cl.
  *G06Q 10/06* (2012.01)
  *G06Q 50/06* (2012.01)
  *G06Q 50/30* (2012.01)
  *G06F 30/23* (2020.01)
  *G06F 30/20* (2020.01)

(52) U.S. Cl.
  CPC ............. *G06Q 10/20* (2013.01); *G06Q 50/06* (2013.01); *G06Q 50/30* (2013.01); *G06F 30/20* (2020.01)

(58) Field of Classification Search
  USPC ........................................ 703/2, 5; 706/7, 11
  See application file for complete search history.

(56) References Cited

U.S. PATENT DOCUMENTS

| | | | | |
|---|---|---|---|---|
| 7,462,080 B2 * | 12/2008 | Shiraishi | ............. | H01R 13/113 439/852 |
| 7,693,900 B2 * | 4/2010 | Wilmering | ............ | G06F 16/367 707/713 |
| 7,697,727 B2 * | 4/2010 | Xu | ........................ | G01C 11/025 382/108 |
| 7,710,259 B2 * | 5/2010 | Miller | .................... | G08B 19/00 340/522 |
| 7,860,618 B2 * | 12/2010 | Brandstetter | .......... | G06Q 10/06 701/29.3 |
| 7,895,821 B2 | 3/2011 | Annigeri et al. | | |
| 7,953,506 B2 * | 5/2011 | Tookey | ................... | G06F 30/15 700/98 |
| 8,356,484 B2 | 1/2013 | Snider | | |
| 8,452,475 B1 | 5/2013 | West et al. | | |
| 8,700,363 B2 | 4/2014 | Heinzerling | | |
| 9,267,443 B2 * | 2/2016 | Chandler | ................... | F23R 3/34 |
| 9,328,670 B2 * | 5/2016 | Chandler | ................... | F02C 9/26 |
| 9,354,618 B2 | 11/2016 | Ozawa | | |
| 9,482,159 B2 * | 11/2016 | Ozawa | ....................... | F02C 3/28 |
| 9,617,010 B2 * | 4/2017 | Conrad | .................. | B64D 45/00 |
| 10,522,250 B2 * | 12/2019 | Spohn | ................... | A61M 5/142 |
| 2006/0276985 A1 * | 12/2006 | Xu | ........................ | G01C 11/025 702/81 |
| 2010/0162678 A1 * | 7/2010 | Annigeri | ................... | F02C 3/22 60/39.281 |
| 2014/0088887 A1 * | 3/2014 | Poon | ....................... | G01M 13/00 702/34 |
| 2016/0132773 A1 * | 5/2016 | Chandrasekaran | ...... | G06N 5/04 706/11 |
| 2016/0170997 A1 * | 6/2016 | Chandrasekaran | ...... | G06N 5/04 707/732 |
| 2020/0118676 A1 * | 4/2020 | Spohn | ................. | A61M 5/1723 |

FOREIGN PATENT DOCUMENTS

| | | |
|---|---|---|
| EP | 2266880 A1 | 12/2010 |
| EP | 2390742 A1 | 11/2011 |
| EP | 2801879 A1 | 11/2014 |
| JP | H04-068580 B2 | 11/1992 |
| JP | H09-329595 A | 12/1997 |
| JP | 2004-340590 A | 12/2004 |
| JP | 2005-077111 A | 3/2005 |
| JP | 2006-300712 A | 11/2006 |
| JP | 2007-263603 A | 10/2007 |
| JP | 2009-192221 A | 8/2009 |
| JP | 2014-517288 A | 7/2014 |
| JP | 2015-515001 A | 5/2015 |
| WO | 2013191594 A1 | 12/2013 |

OTHER PUBLICATIONS

Japanese Search Report issued in connection with corresponding JP Application No. 2016-032577 dated Jan. 31, 2017.
Notification of Reasons for Refusal issued in connection with corresponding JP Application No. 2016-032577 dated Mar. 7, 2017.
Decision to Grant issued in connection with corresponding JP Application No. 2016-032577 dated Jun. 13, 2017.
European Search Report and Opinion issued in connection with corresponding EP Application No. 16158063.4 dated Jul. 5, 2016.

* cited by examiner

METHOD OF EVALUATING A PART

CROSS-REFERENCE TO RELATED APPLICATION

This application is a continuation of U.S. application Ser. No. 14/635,581, filed on Mar. 2, 2015, titled "METHOD OF EVALUATING A PART", which is hereby expressly incorporated herein by reference in its entirety.

BACKGROUND OF THE INVENTION

Diagnostics and prognostics, as applied to the operation of complex systems such as aircraft, aircraft engines, medical equipment, power plants etc., provide data and estimates that relate to the fitness for service and remaining life of the individual components of the system. Dependable evaluation of individual components of complex systems allows system planners to better operate and maintain these complex systems. For example, with respect to aircraft, early detection of hardware distress is vital to preventing in-flight shutdowns, unplanned engine removals and/or secondary hardware damage. With earlier detection, system planners may more readily schedule maintenance and replace hardware without the need for a full system overhaul.

BRIEF DESCRIPTION OF THE INVENTION

In one aspect, a method of evaluating a part is characterized by obtaining data representing a distress rank model (DRM) for the part; ascertaining a DRM value for the part; obtaining data representing a cumulative damage model (CDM) for the part; ascertaining a CDM value for the part; determining whether the DRM value is at or above at least one predetermined DRM threshold; and determining whether a CDM value is at or above at least one predetermined CDM threshold. If either the DRM value or the CDM value is at or above at least one respective threshold, an action related to the part generated.

DETAILED DESCRIPTION OF THE INVENTION

Figure 1:
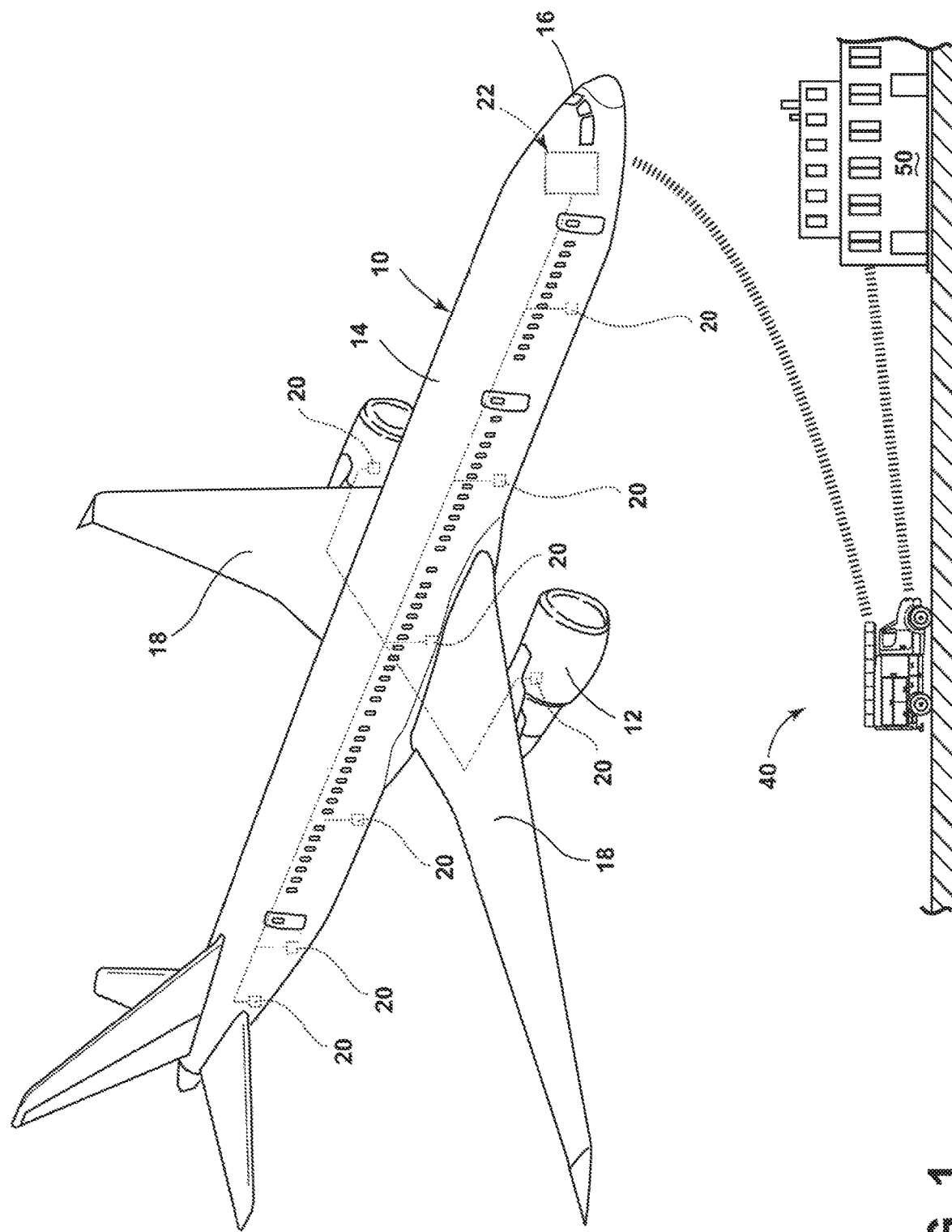
FIG. 1 is a perspective view of an aircraft during a maintenance procedure during which diagnostic data may be gathered.

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and device are shown in diagram form in order to facilitate description of the exemplary embodiments.

The exemplary embodiments are described with reference to the drawings. These drawings illustrate certain details of specific embodiments that implement a module, method, or computer program product described herein. However, the drawings should not be construed as imposing any limitations that may be present in the drawings.

FIG. 1 schematically depicts one embodiment of an exemplary aircraft 10 during a maintenance operation transmitting data, ultimately, to a data operations center 50 that will execute embodiments of the diagnostic and prognostic method presented herein. The aircraft 10 includes one or more complex systems that include multitudinous parts therein, the complex systems relating to various aspects of the aircraft. The aircraft includes one or more propulsion engines 12, a fuselage 14 with a cockpit 16 positioned in the fuselage 14, and the one or more propulsion engines 12 coupled to the fuselage 14 directly or, as shown, by way of wing assemblies 18 extending outward from the fuselage 14. While a commercial aircraft has been illustrated, it is contemplated that embodiments of the invention may be used in any type of complex system, including, for example, power plants, ships, trains, buildings, space craft, and aircraft different than the present embodiment, including fixed-wing, rotating-wing, rocket, personal aircraft, etc.

A plurality of aircraft subsystems 20 that enable proper operation of the aircraft 10 may be included in the aircraft 10 as well as one or more computers or controllers 22, which may be operably coupled to the plurality of aircraft subsystems 20 to control their operation. While only a single controller 22 has been illustrated, it is contemplated that any number of controllers 22 may be included in the aircraft 10. In such an instance, the controller 22 may also be connected with other controllers of the aircraft 10. The controller 22 may include or be associated with any suitable number of individual microprocessors, power supplies, storage devices, interface cards, auto flight systems, flight management computers, and other standard components. In addition to components for the proper operation of the aircraft, an aircraft subsystem 20 may include sensor components for observing, gathering and transmitting data related to the operational life of the parts of the system. The data may then be transmitted to one or more controllers 22.

The controller 22, possibly including a health management unit (not shown), may be communicably coupled to one or more communication links to transfer data to and from the aircraft 10. It is contemplated that the communication links may be wireless communication links and may be any variety of communication mechanism capable of wirelessly linking with other systems and devices and may include, but is not limited to, packet radio, satellite uplink and/or downlink, Wireless Fidelity (WiFi), WiMax, Bluetooth, ZigBee, 3G wireless signal, code division multiple access (CDMA) wireless signal, global system for mobile communication (GSM), 4G wireless signal, long term evolution (LTE) signal, Ethernet, or any combinations thereof. It will also be understood that the particular type or mode of wireless communication is not critical to embodiments of the invention, and later-developed wireless networks are certainly contemplated as within the scope of embodiments of the invention. Further, the communication links may include one or more radios including voice, ACARS-analog, ACARS-digital, SATCOM, cellular, etc. The communication links may allow for communication with maintenance personnel via, for example a maintenance vehicle 40, ground controllers or data operations center 50 at a ground-based station or with non-ground stations such as satellite (not shown).

Further, while data communicated to the data operations center 50 via a maintenance vehicle 40 has been illustrated, it will be understood that the aircraft 10 may communicate directly with the data operations center 50 utilizing the communication links. At the data operations center 50, a computing system (termed "a processor") processes the data transmitted by the aircraft 10 over the communications link to evaluate an aircraft part and direct further maintenance activities to either identify or rectify the identified issues. The processor may require relatively large amounts of computing power and time and may be performed during a maintenance operation or across multiple flights and maintenance operations.

It will be understood that details of environments that may implement embodiments of the invention are set forth in order to provide a thorough understanding of the technology described herein. It will be evident to one skilled in the art, however, that the exemplary embodiments may be practiced without these specific details. The drawings illustrate certain details of specific embodiments that implement a module or method, or computer program product described herein. However, the drawings should not be construed as imposing any limitations that may be present in the drawings. The method and computer program product may be provided on any machine-readable media for accomplishing their operations. The embodiments may be implemented using an existing computer processor, or by a special purpose computer processor incorporated for this or another purpose, or by a hardwired system.

As noted above, embodiments described herein may include a computer program product comprising machine-readable media for carrying or having machine-executable instructions or data structures stored thereon. Such machine-readable media may be any available media, which may be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium that can be used to carry or store desired program code in the form of machine-executable instructions or data structures and that can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Thus, any such a connection is properly termed a machine-readable medium. Combinations of the above are also included within the scope of machine-readable media. Machine-executable instructions comprise, for example, instructions and data, which cause a general-purpose computer, special purpose computer, or special purpose processing machines to perform a certain function or group of functions.

Embodiments will be described in the general context of method steps that may be implemented in one embodiment by a program product including machine-executable instructions, such as program codes, for example, in the form of program modules executed by machines in networked environments. Generally, program modules include routines, programs, objects, components, data structures, etc. that have the technical effect of performing particular tasks or implement particular abstract data types. Machine-executable instructions, associated data structures, and program modules represent examples of program codes for executing steps of the method disclosed herein. The particular sequence of such executable instructions or associated data structures represent examples of corresponding acts for implementing the functions described in such steps.

Embodiments may be practiced in a networked environment using logical connections to one or more remote computers having processors. Logical connections may include a local area network (LAN) and a wide area network (WAN) that are presented herein by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configurations, including personal computers, hand-held devices, multiprocessor systems, microprocessor-based or programmable consumer electronics, network PCs, mini-computers, mainframe computers, and the like.

Embodiments may also be practiced in distributed computing environments where tasks are performed by local and remote processing devices that are linked (either by hard-wired links, wireless links, or by a combination of hardwired or wireless links) through a communication network. In a distributed computing environment, program modules may be located in both local and remote memory storage devices.

Figure 2:
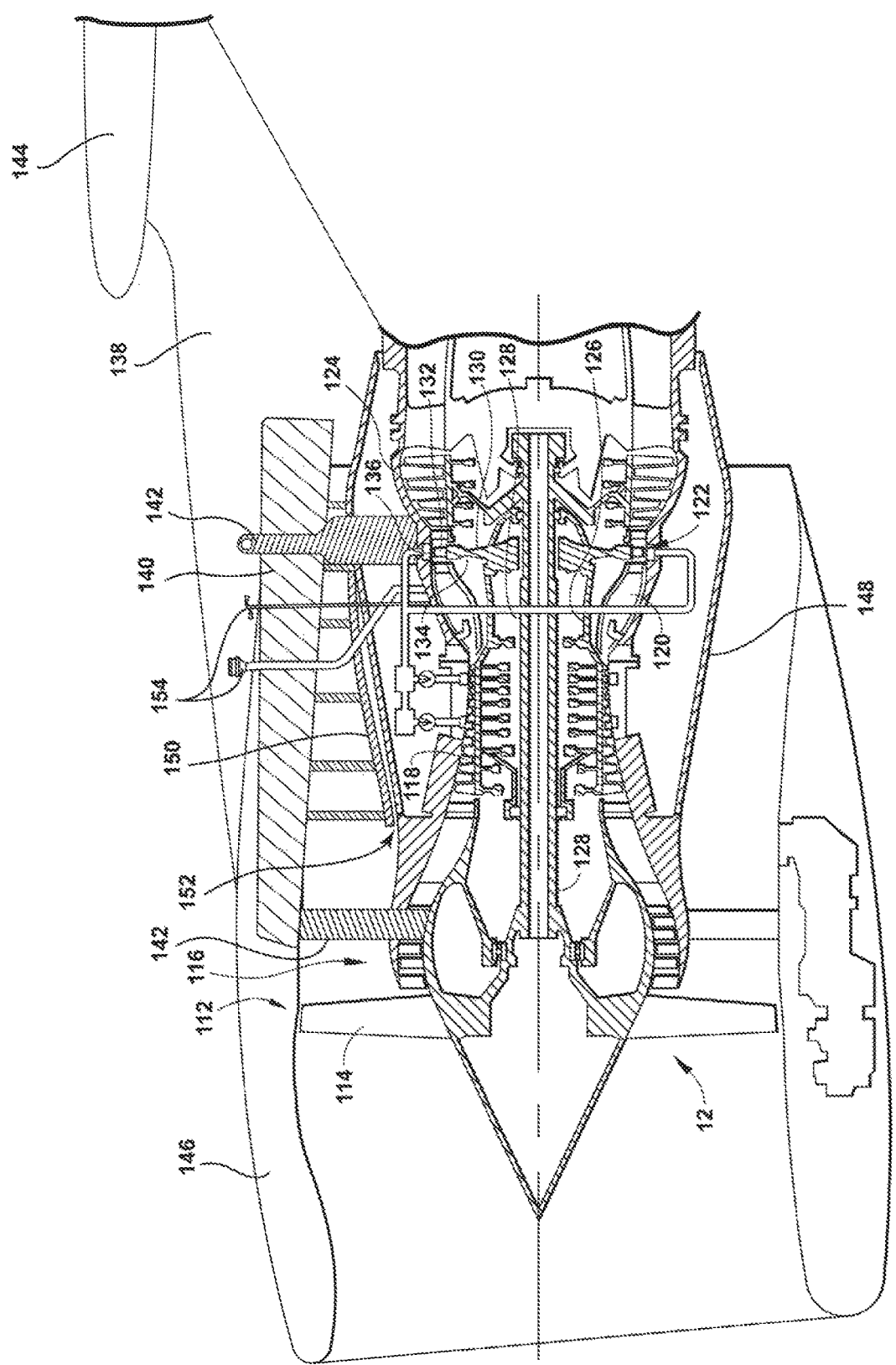
FIG. 2 is a cross-sectional side view of a typical gas turbine engine from which diagnostic data may be gathered.

At the data operations center 50, a processor may obtain and ascertain data to evaluate an aircraft part, collection of parts, a system or subsystem and direct further maintenance activities to either identify or rectify the identified issues. As an example of a complex system that includes multitudinous parts subject to observation, data gathering, diagnostics and prognostication, consider a gas turbine engine 12 on an aircraft 10. Referring now to FIG. 2, a schematic cross-sectional diagram of a gas turbine engine 12 for an aircraft is shown. The engine 12 includes, in downstream serial flow relationship, a fan section 112 including a fan 114, a booster or low pressure (LP) compressor 116, a high pressure (HP) compressor 118, a combustion section 120, a HP turbine 122, and a LP turbine 124. A HP shaft or spool 126 drivingly connects HP turbine 122 to HP compressor 118 and a LP shaft or spool 128 drivingly connects LP turbine 124 to LP compressor 116 and fan 114. HP turbine 122 includes a HP turbine rotor 130 having turbine blades 132 mounted at a periphery of rotor 130. Blades 132 extend radially outwardly from blade platforms 134 to radially outer blade tips 136.

The engine 12 is shown mounted to the pylon 138, at a pylon bracket 140, by both aft and fore engine mounts 142. The pylon 138, as illustrated, further secures to the aircraft wing 144, but may be secured at alternate positions of the aircraft, such as the fuselage.

The engine 12 further includes an outer cowl 146 and an inner cowl 148, each having smooth surfaces to reduce the drag of air passing inside or outside the engine 12 in flight. The outer cowl 146 encircles at least a portion of the inner cowl 148 and the engine 12. The pylon 138 further comprises bifurcation walls 150, partially extending from the pylon 138 toward the inner cowl 148, defining a gap 152.

Also illustrated are a multitude of connector lines 154, such as hydraulic lines, electrical lines and bypass air lines, extending from the engine 12 through the bifurcation walls 150 into the pylon 138. These lines 154 couple the engine 12 to subsystems necessary for operation, such as fuel pumps and flight control computers.

Sensors proximate or coupled to any of the aircraft parts may observe and generate data related to one or more sensed physical parameters of the parts of the system. Example physical parameters may derive from measurements of properties such as, but not limited to, pressure, temperature, strain, etc. The data may include measurements correlated to the amount of time or number of cycles that a given aircraft part is subject to various levels of pressure, temperature, strain etc. During maintenance operations, observations may result from visual inspection of an aircraft part. The sensed or observed data may result from observation via visual inspection with or without the aid of electro-optical equipment such as a boresight system or the aid of radiometric or spectrographic systems. Pre-processing of observation data may include processing observation data with image enhancement or predictive algorithms. Modeling of the data with processing-intensive routines such as provided by finite element analysis may further enhance the observational data.

Data acquired are not limited to sensors proximate or coupled to the monitored equipment, but can include environmental data such as weather data, geographical location, satellite images, and any other data or information or knowledge that will improve accuracy and precision of prognostic and diagnostic process.

In addition to the above, data acquired can be inferred data or data that is not measured directly but can be inferred using one or more measured data either in combination of understanding the physics of the part or the system or not. In one non-limiting example, some temperatures inside an engine cannot be directly measured but can be inferred by knowing engine cycle physics and other directly measured parameters that may include environmental parameters or engine sensor parameters.

Figure 3:
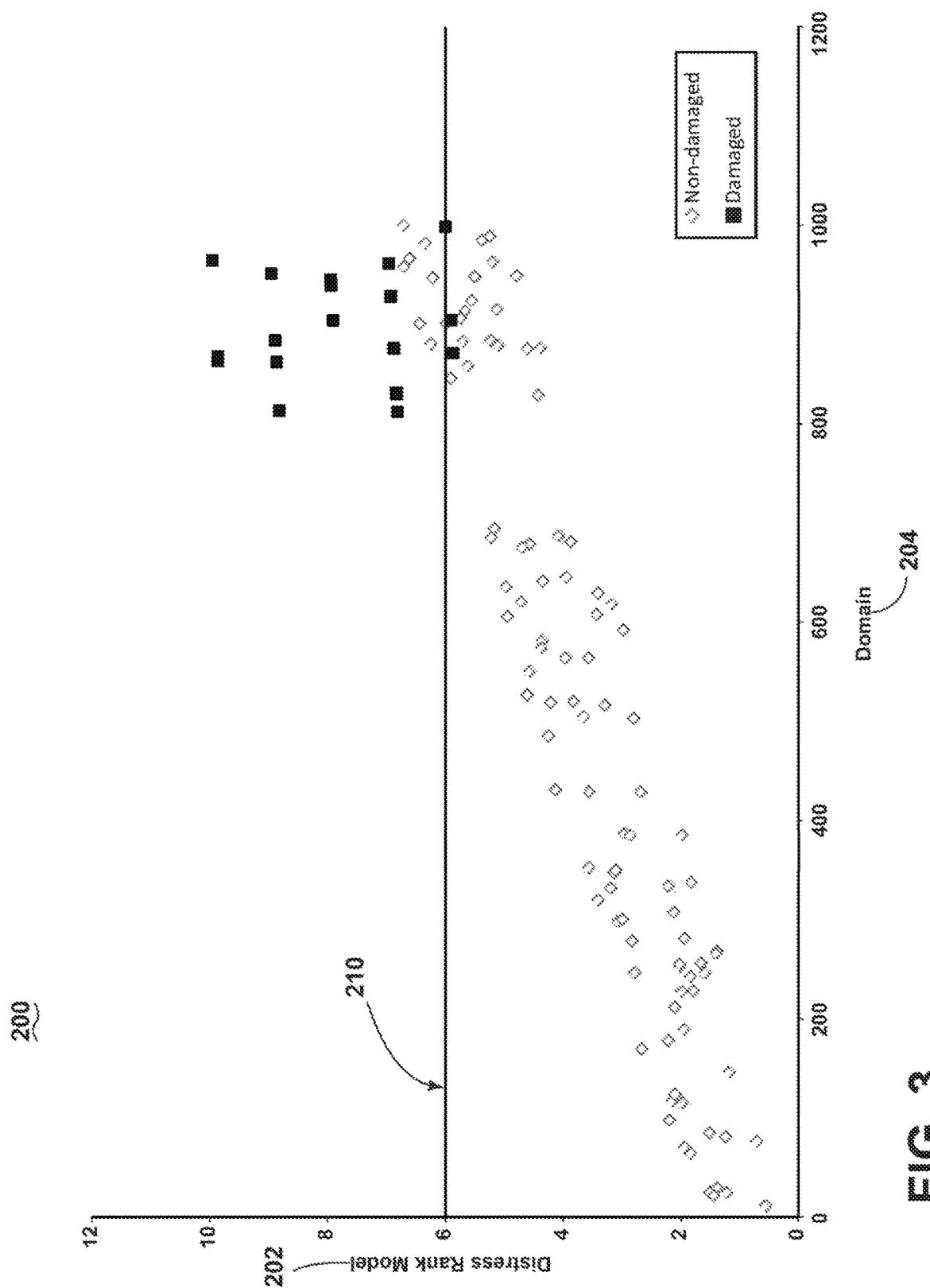
FIG. 3 is a scatter diagram depicting a distress rank model versus a domain for a set of damaged and non-damaged parts.

As described above, the processor at the data operations center 50 obtains data relating to the observed state, condition or operational environment of an aircraft part, which data may be plotted as shown for example in a scatter diagram 200 in FIG. 3. Accordingly, the processor obtains data representing a distress rank model (DRM) 202 for the aircraft part. The DRM 202 ranks the relative observed hardware distress levels and then uses regression analysis of multiple aircraft part sensor data to determine an optimum transfer function to ascertain a DRM value that quantifies the hardware distress for the aircraft part. For example, for a domain described as x, a sample linear regression model for the DRM 202 may be of the form: $y_{DRM} = \beta_0 + \beta_1 x$. The model is fit to the data using methods common to regression analysis, for example, by ordinary least squares, etc. A transfer function formed from the DRM 202, among other things, may forecast how the level of distress to an aircraft part will progress along the domain (e.g. cycles).

FIG. 3 depicts an exemplary DRM 202 versus a domain 204 for a set representing damaged and non-damaged parts. Multiple data points depicting DRM values for aircraft parts are shown, plotted on the y-axis. Both non-damaged and damaged parts are shown where the damaged parts indicate an aircraft part that is shown to be damaged through a visual inspection of the part that confirms that the part is damaged to a point where it needs to be replaced. The domain 204 on the x-axis depicts a characteristic such as time duration an aircraft engine is running or number of cycles (i.e. the number of times an engine is taken from start to high power to shutdown). As shown in the scatter diagram, a threshold 210 may be predetermined such that an aircraft part with a DRM value above the predetermined threshold may be indicative of a damaged part. As seen in FIG. 3, the threshold does not perfectly delineate between actually damaged and non-damaged parts. Instead, some damaged parts have a DRM value below the threshold and constitute missed detections and some non-damaged parts have a DRM value above the threshold and constitute false positives.

Figure 4:
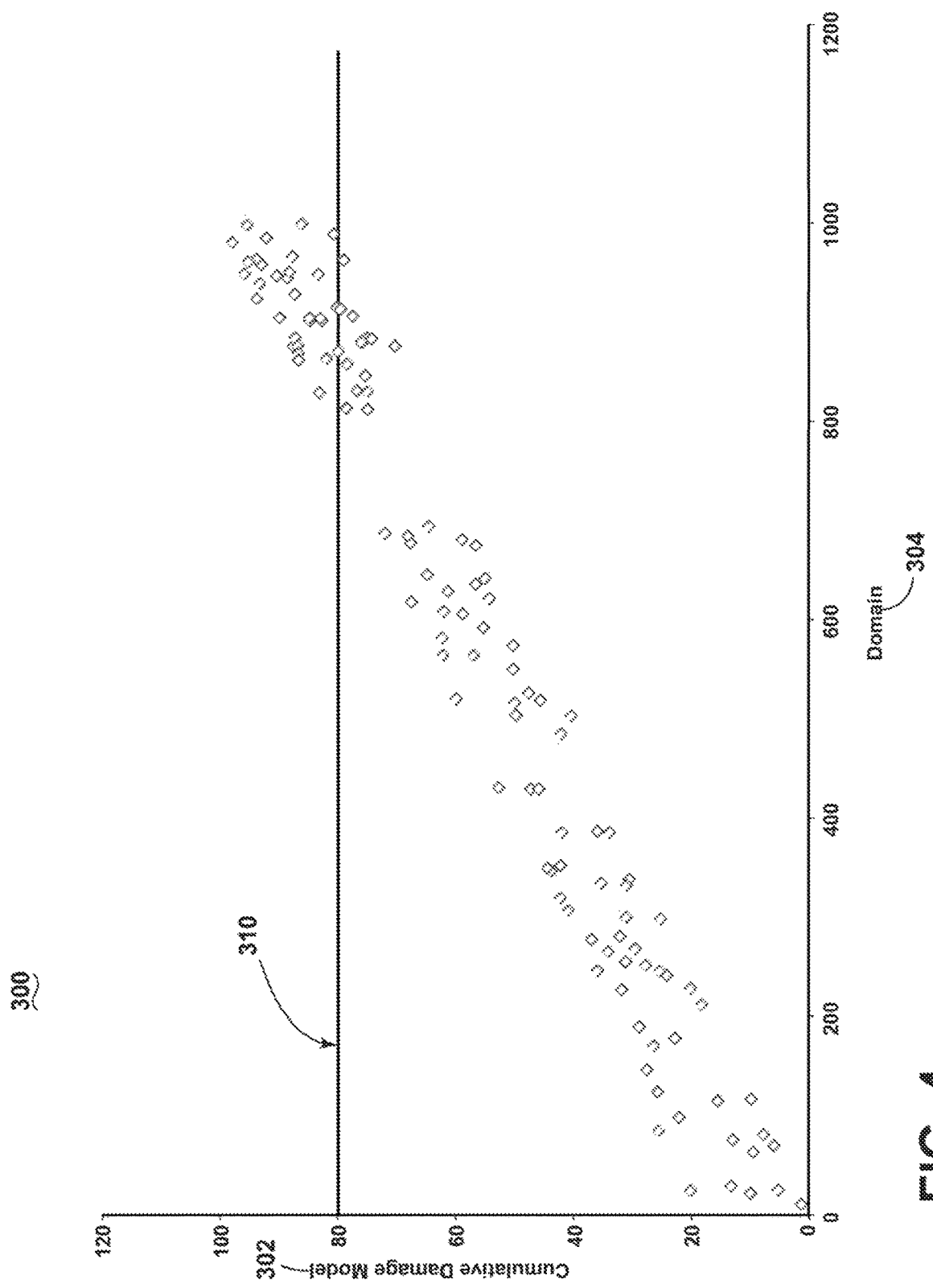
FIG. 4 is a scatter diagram depicting a cumulative damage model versus a domain for a set of parts.

The processor at the data operations center 50 also obtains data relating to a physical phenomenon representing an aircraft part such as may be derived from sensors, which data may be plotted as shown for example in a scatter diagram 300 in FIG. 4. Accordingly, the processor obtains data representing a cumulative damage model (CDM) 302 for the aircraft part. The CDM 302 determines the physical phenomenon driving the distress of an aircraft part and then evaluates the data to quantify the relative hardware distress of the aircraft part. To arrive at a value of the relative hardware distress of the aircraft part, the CDM 302 uses a physics-based model of an aircraft part's lifecycle. In this way, the CDM 302 accumulates over the domain. For example, the CDM 302 may indicate the total time an aircraft part has been at or above a critical temperature as a function of engine cycles.

FIG. 4 depicts an exemplary CDM 302 versus a domain 304 for a set of parts. The CDM 302 determines the physical phenomenon driving the distress and describes the relative hardware distress. Multiple data points depicting CDM values for aircraft parts are shown, plotted on the y-axis. The domain 304 on the x-axis depicts a characteristic such as time duration an aircraft engine is running or cycles over which the CDM 302 accumulates. As shown in the scatter diagram, a threshold 310 may be predetermined such that an aircraft part with a CDM value above the predetermined threshold may be indicative of a damaged part.

Figure 5:
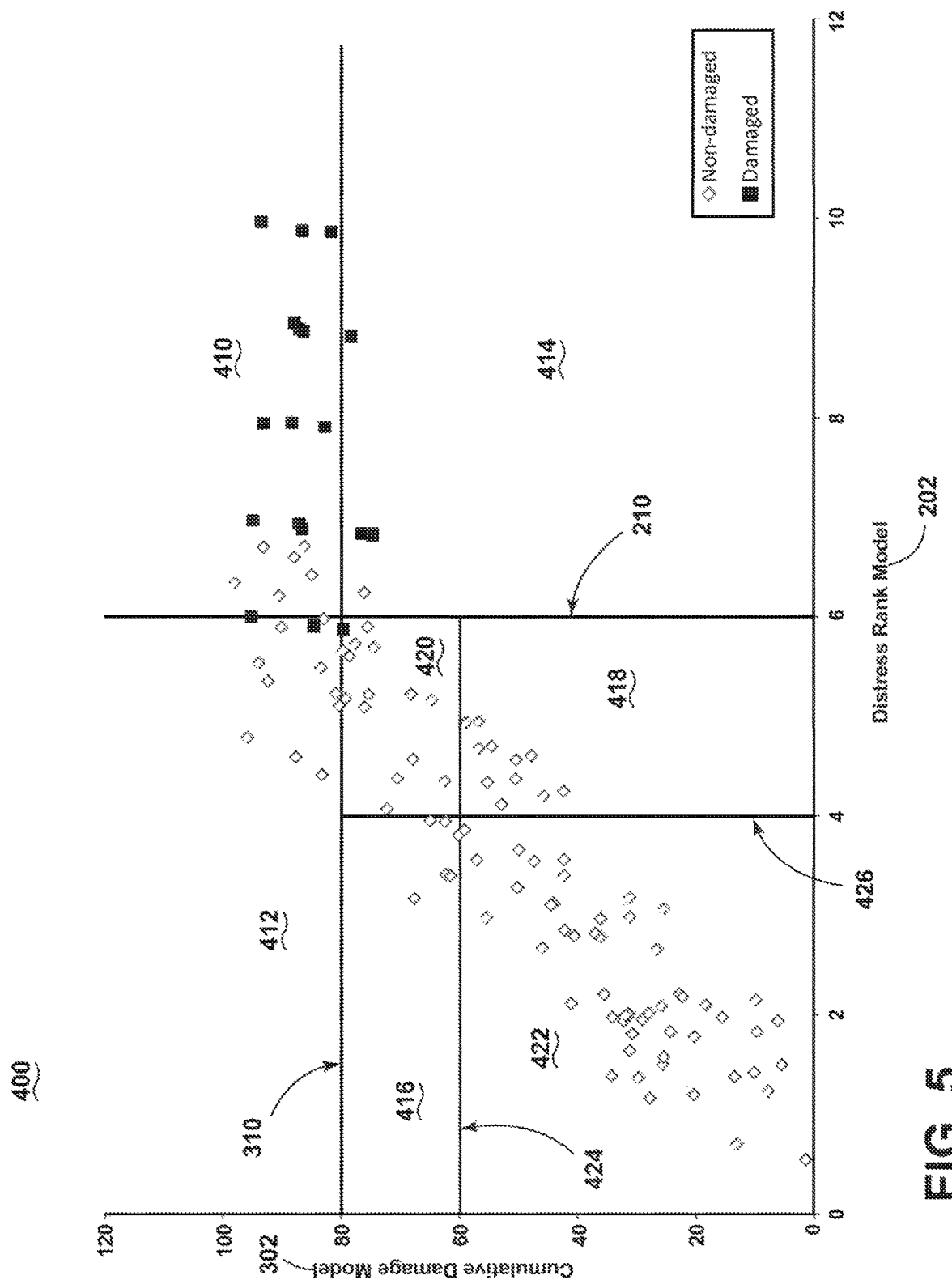
FIG. 5 is a scatter diagram depicting a cumulative damage model versus a distress rank model for a set of damaged and non-damaged parts.

According to embodiments of the present invention, the processor at the data operations center 50 executes a method to combine the two separate, but complimentary, analytical algorithms of the DRM 202 and the CDM 302 to independently quantify the relative distress and remaining life of the various gas turbine hardware parts. The DRM 202 is a diagnostic function that detects the actual, observed distress on the aircraft part. The CDM 302 is a prognostic function that independently calculates component life consumption based on actual engine operation. In combination, the detection capability of a hardware part distress is further enhanced. FIG. 5 is a scatter diagram 400 depicting the CDM 302 versus the DRM 202 for a set of damaged and non-damaged parts. Both the DRM threshold 210 and the CDM threshold 310 are shown. Additional thresholds, shown as a second DRM threshold 426 and a second CDM threshold 424 in FIG. 5, may also be predetermined. It is contemplated that each model may include a plurality of stepped thresholds.

Based on the ascertained values for the DRM and the CDM, an aircraft part is located in a zone defined by the model values and its relation to the thresholds. Based on a zone for the part, the processor may generate an action related to the aircraft part and its CDM and DRM values. For example, the most critical threshold zone 410 is located in the upper right of the diagram in FIG. 5 where the values for the given part may exceed both DRM and CDM thresholds 210 and 310, respectively. When the processor determines an aircraft part is located in the critical threshold zone 410 because both the DRM and CDM exceed their respective thresholds 210 and 310, the processor may generate an urgent notification that requires inspection, repair or replacement of the aircraft part. If only the DRM value meets or exceeds the threshold 210 (and the aircraft part's model values are located in the threshold zone 414), or if only the CDM threshold meets or exceeds the threshold 310 (and the aircraft part's model values are located in the threshold zone 412), the processor may generate a normal notification for inspection, repair or replacement of the aircraft part. Additional threshold zones 416, 420, 418 are indicative of aircraft parts that the processor determines to be within a certain limit of requiring inspection, repair or replacement. In the case where the CDM and DRM are based on a domain of cycles, these zones are indicative of an aircraft part within a predetermined number of cycles of issuance of a notification for inspection, repair or replacement. Similarly, where the processor determines that the aircraft part does not exceed any thresholds (e.g. threshold zone 422), the processor may still estimate the number of cycles until a maintenance action and issue a notification with the estimate.

Figure 6:
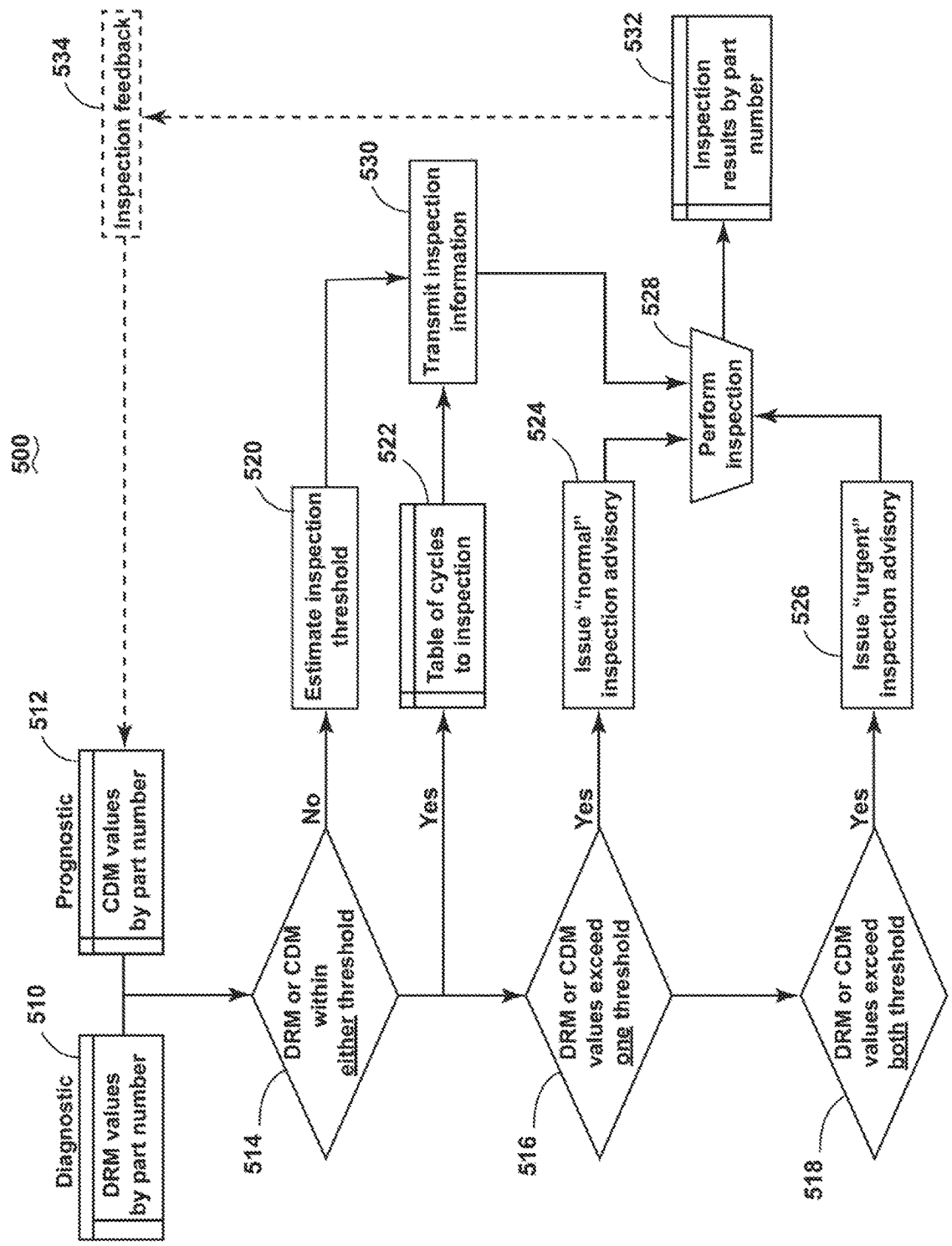
FIG. 6 is a flow chart depicting a method of evaluating an aircraft part.

FIG. 6 is a flow chart depicting a method 500 of evaluating an aircraft part according to an embodiment. The processor integrates the two models together in a process where CDM and DRM thresholds are set to maximize the hardware distress detection capability of the method 500. At step 510, the processor obtains data representing a DRM and ascertains a DRM value for an aircraft part. Each aircraft part is uniquely identified such as by part number or serial number. At step 512, the processor obtains data representing the CDM and ascertains a CDM value for the aircraft part. The processor at step 514 determines if the DRM value or the CDM value for the aircraft part is within or approaching either the DRM or the CDM threshold. If neither the DRM value nor the CDM value for the aircraft part is within the respective threshold, then the processor, at step 520, estimates the time as expressed for example as engine hours or cycles where the operator of the engine may have to take a predetermined action, for example inspection, maintenance removal or replacement. Otherwise, at step 522, the processor generates and stores estimates relating to when an action is likely to be required for the aircraft part in a database. Subsequent to either steps 520 or 522, the processor may transmit remaining time or cycles information related to the aircraft part to airline planners or maintenance personnel at step 530.

If the processor, at step 516, determines that the aircraft part's DRM value or CDM value (but not both) exceeds a respective threshold, then the processor may issue a normal urgency advisory at step 524. If the processor determines at step 518 that the aircraft part's DRM value and CDM value each exceeds its respective threshold, then the processor may issue an urgent advisory at step 526.

Subsequent to any of steps 524, 526 or 530, maintenance personnel may react to an advisory or to remaining time or cycles information and perform a recommended action of the aircraft part at step 528. Any new inspection results are stored by aircraft part number in step 532. The processor receives the inspection information and uses the information as a feedback mechanism at step 534. Based on generating and monitoring the feedback which includes the DRM value, the CDM value and the results of the visual inspection determination of the amount of damage of the aircraft part, the processor may improve the models (i.e. the DRM and CDM) as well as the thresholds used to generate actions.

The above-described method may include additional or alternative non-limiting steps. In one non-limiting example of alternative or additional steps to the method, the processor includes steps to execute one or more voting algorithms to integrate the results of the CDM and DRM into a specific action with low probability of false positives or negatives. In another non-limiting example, includes the developments, generation or implementation of a fused CDM/DRM model. In such a fused model, the processor fuses the physics knowledge underpinning the CDM and the empirical data findings underpinning DRM together to create a single fused model.

The above-described embodiments evaluate aircraft parts by diagnosing and prognosticating the condition of said parts based on obtained data. The resulting detection capability is then used to enhance engine diagnostics, quantify hardware distress and potentially improve engine time-on-wing (TOW).

Technical effects of the above-described embodiments include faster decision support as the method reduces the disruption of unplanned engine removals, prevents the added expense of secondary hardware damage and improves the TOW between engine overhauls. In addition, embodiments of the method reduce the airline inspection burden for engines where the distress levels are below the predetermined distress threshold.

The method provides airline customers and service providers with key knowledge to better manage and maintain their operating fleet. Reducing unplanned engine removals and increasing time between engine overhauls improves engine availability and reduces operating costs and allows for improved long-term prediction of future distress and overhauls thereby reducing the risk on multi-year service plans.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for detecting hardware distress of an aircraft (AC) part, comprising:
    a distress rank model (DRM) process including:
    ranking, via a processor, observed distress levels of the part responsive to received first type data associated therewith;
    creating, via the processor, a linear regression model of the received first type data, the ranking and the creating quantifying a hardware distress level of the part;
    forming a transfer function from the quantified hardware distress level to forecast future levels of distress of the part over a cycle related domain; and
    a cumulative damage model (CDM) process including:
    receiving, via the processor, second type data associated with the part; and
    executing, via the processor, a physics-based model of the part's lifecycle to accumulate the second type data over the cycle related domain;
    wherein the DRM and CDM processes are integrated together to produce respective DRM and CDM thresholds representative of future actions related to the part within the cycle related domain.

2. The method of claim 1, further comprising:
    generating and monitoring feedback from which the DRM, the CDM, or both can be improved.

3. The method of claim 1, wherein the DRM includes a regression model or other statistical based algorithm.

4. The method of claim 1, wherein the first type data is indicative of at least one of an observed state, a condition, and an operational environment; and wherein the second type data is indicative of a physical phenomenon.

5. The method of claim 1, wherein a first alert occurs when only one of the DRM and CDM respective thresholds is satisfied; and wherein a second alert occurs when each of the DRM and the CDM respective thresholds is satisfied.

6. A computer-readable, non-transitory storage medium storing instructions that, when executed by a hardware processor causes the hardware processor to execute a method comprising:

a distress rank model (DRM) process including:

ranking, via a processor, observed distress levels of the part responsive to received first type data associated therewith;

creating, via the processor, a linear regression model of the received first type data, the ranking and the creating quantifying a hardware distress level of the part;

forming a transfer function from the quantified hardware distress level to forecast future levels of distress of the part over a cycle related domain; and a cumulative damage model (CDM) process including:

receiving, via the processor, second type data associated with the part; and executing, via the processor, a physics-based model of the part's lifecycle to accumulate the second type data over the cycle related domain;

wherein the DRM and CDM processes are integrated together to produce respective DRM and CDM thresholds representative of future actions related to the part within the cycle related domain.

7. The computer-readable, non-transitory storage medium of claim 6, wherein the first type data is indicative of at least one of an observed state, a condition, and an operational environment; and wherein the second type data is indicative of a physical phenomenon.

8. The computer-readable, non-transitory storage medium of claim 6, wherein a first alert occurs when only one of the DRM and CDM respective thresholds is satisfied, and wherein a second alert occurs when each of the DRM and the CDM respective thresholds is satisfied.

9. The computer-readable, non-transitory storage medium of claim 6, wherein the method further comprises generating and monitoring feedback from which the DRM, the CDM, or both can be improved.

10. The computer-readable, non-transitory storage medium of claim 6, wherein the DRM includes a regression model or other statistical based algorithm.

* * * * *